United States Patent
Cook

(10) Patent No.: US 6,870,349 B2
(45) Date of Patent: Mar. 22, 2005

(54) BATTERY LIFE ESTIMATOR

(75) Inventor: Steven D. Cook, Tigard, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/205,521

(22) Filed: Jul. 24, 2002

(65) Prior Publication Data

US 2004/0017180 A1 Jan. 29, 2004

(51) Int. Cl.$^7$ ................................. H02J 7/00
(52) U.S. Cl. ............................ 320/132; 320/130
(58) Field of Search ............................ 320/132, 130, 320/137, 127, 125, 106; 324/426, 427, 428

(56) References Cited

U.S. PATENT DOCUMENTS

| | | | | |
|---|---|---|---|---|
| 5,254,928 A | | 10/1993 | Young et al. ............... | 320/125 |
| 5,587,924 A | * | 12/1996 | Rossi ......................... | 320/106 |
| 5,600,230 A | * | 2/1997 | Dunstan .............. | 320/DIG. 21 |
| 5,717,307 A | | 2/1998 | Barket et al. ............... | 307/125 |
| 6,114,831 A | | 9/2000 | Attimont et al. ............ | 320/106 |
| 6,169,387 B1 | * | 1/2001 | Kaib .......................... | 320/132 |
| 6,211,858 B1 | * | 4/2001 | Moon et al. ................. | 345/146 |
| 6,300,763 B1 | * | 10/2001 | Kwok ......................... | 324/427 |

FOREIGN PATENT DOCUMENTS

| | | |
|---|---|---|
| JP | 07-087007 | 3/1995 |
| JP | 07-241039 | 9/1995 |
| JP | 07-319589 | 12/1995 |
| JP | 10-186010 | 7/1998 |
| JP | 10-207585 | 8/1998 |
| JP | 11-045133 | 2/1999 |

OTHER PUBLICATIONS

IBM TDB vol. 40, No. 4, Apr. 1997, pp. 191–194, "Method for Determining Battery Type and Remaining Battery Life".

* cited by examiner

*Primary Examiner*—Michael Sherry
*Assistant Examiner*—Lawrence Luk
(74) *Attorney, Agent, or Firm*—Lieberman & Brandsdorfer, LLC

(57) ABSTRACT

A method and apparatus are provided to calculate capacitance remaining on a power source in a battery powered device. A database is provided to store data associated with past battery performance data and data associated with a battery operating the device. The battery data includes battery drainage factors associated with the battery make and model, and the percent of time the apparatus has historically operated in a particular status. An algorithm is provided utilizing current and past data associated with the power source and the associated device to calculate time remaining for operation of the device with the current power source.

15 Claims, 2 Drawing Sheets

| Type ID | Type | Brand | Size | Battery Readings | Idle BBC | Active BBC | Off BBC | % Idle | % Active | % Off | Historical BL |
|---|---|---|---|---|---|---|---|---|---|---|---|
| 1 | NiCd | Duracell | AA | 10 | 4 | 5 | 1 | 5 | 4 | 91 | 3,543,700 |
| 2 | NiCd | Eveready | AA | 11 | | | | | | | |
| 3 | | | | | | | | | | | |
| 4 | | | | | | | | | | | |

Battery History Table

Figure 1

Battery History Table 14

| Type ID 22 | Type 24 | Brand 26 | Size 28 | Battery Readings 30 | Idle BDC 32 | Active BDC 34 | Off BDC 36 | % Idle 38 | % Active 40 | % Off 42 | Historical BL 44 |
|---|---|---|---|---|---|---|---|---|---|---|---|
| 1 | NiCd | Duracell | AA | 10 | 4 | 5 | 1 | 5 | 4 | 91 | 3,543,700 |
| 2 | NiCd | Eveready | AA | 11 | | | | | | | |
| 3 | | | | | | | | | | | |
| 4 | | | | | | | | | | | |

Current Battery Table

| Insert Date | Insert Time | Type ID | Idle Time | Active Time | Off Time |
|---|---|---|---|---|---|
| 03/18/2002 | 04:00:25 | 1 | 145,000 | 108,900 | 2,419,200 |
| | | | | | |
| | | | | | |

FIG. 2

BATTERY LIFE ESTIMATOR

BACKGROUND OF THE INVENTION

1. Technical Field

This invention relates to a method and apparatus to estimate a capacitance in a battery. More specifically, a process for calculating time remaining for operation of a battery operated device.

2. Description of the Prior Art

Many electronic devices today require electrical power for operation. Some of these devices are connected to conventional AC power supplies. However, in recent years laptop computers and personal digital assistants have become popular. These type of portable devices, as well as other devices that require a power supply for operation, require portable power sources, such as batteries, for operation when an AC power supply is not available. Power failure associated with such devices may result in loss of data or other failure of the device. Therefore, it is necessary to have information regarding the remaining power supply or battery life available from a specific battery while in use in an electronic device. It is desirable that the device provide an indication to the operator when power remaining from the power supply is insufficient to continue operation of the device, so that the operator may have a sufficient amount of time to save their data and properly shut-down operation of the device.

Recent developments in battery technology include the use of a discharge control circuit that serves to estimate the voltage drop of a battery based upon the current output of electrical power from the battery. The discharge control circuit is incorporated within the battery. By incorporating the discharge control circuit within the battery, the costs associated with the manufacture of the battery, as well as the overall size of the battery, are increased. Other prior art solutions include the use of battery type detectors and temperature sensors within the device utilizing the battery as a means of estimating battery life. There are shortcomings associated with the prior art solutions for providing an accurate calculation of time remaining on a battery for proper operation of a battery powered device. In general, the solutions to date require an added expense in either the manufacture of the battery, such as a discharge control circuit, or in the battery powered device, such as the incorporation of temperature sensors. Accordingly, it is desirable to provide a solution that enables the battery operated device to operate with either conventional batteries or "smart" batteries (i.e. batteries that incorporate technology such as the discharge control circuit) while still providing an accurate calculation of the time remaining for operation of the device with the current battery supply.

SUMMARY OF THE INVENTION

This invention comprises a method and apparatus for accurately determining capacitance remaining on a power source for operation of a device.

In a first aspect of the invention, a method for calculating capacitance remaining in a battery powered apparatus is provided. The method dynamically tracks power usage and calculates time remaining for usage of the power based upon a battery drainage factor and usage of the power source. The method preferably includes graphically displaying the remaining power usage time. The step of dynamically tracking power usage may include tracking current and past usage patterns of the apparatus. Battery information may be identified. The battery drainage factor may be an idle battery drainage factor, an active battery drainage factor, and/or an off battery drainage factor. The method may include calculating a new historical battery drainage factor by averaging a prior battery drainage factor with a historical battery drainage factor. In addition, the step of calculating time remaining for usage of the power source may include a historical usage factor of a power receiving apparatus, such as the percent of time the apparatus has operated in a particular state.

In a second aspect of the invention, an apparatus adapted to receive a power source having a database of past battery performance data, a database of current battery performance data, and an algorithm to determine usage time remaining in the power source is provided. The database of past battery performance may include factors for battery type, battery size, battery make, battery drainage, and device usage pattern. In addition, the algorithm is preferably based upon a type of battery operating the apparatus. An interface may be provided to enable an operator to interact with the database. Accordingly, the apparatus includes a database of past performance data, a database of current power supply usage, and utilizes the data to determine usage time remaining.

Other features and advantages of this invention will become apparent from the following detailed description of the presently preferred embodiment of the invention, taken in conjunction with the accompanying drawings.

BRIEF DESCRIPTION OF THE DRAWINGS

FIG. 1 is a block diagram of a battery history table according to the preferred embodiment of this invention, and is suggested for printing on the first page of the issued patent.

FIG. 2 is a block diagram of a current battery table.

DESCRIPTION OF THE PREFERRED EMBODIMENT

Overview

The method and apparatus are adapted for use in a battery powered device with a processor. The apparatus includes a database of battery performance data. At the time of installation of a new battery, the operator can select the battery type, make and model from a list of batteries stored in the database, or the battery information may be automatically identified. The processor implements an algorithm to predict usage time remaining on the battery of the device. The algorithm predicts battery usage time remaining for the current battery based upon historical data stored in the database as well as usage data of the current battery.

Technical Background

Battery operated devices commonly include a display to convey battery usage data to an operator. It is common to see this image in the form of a bar graph with icons to convey a level of usage remaining in the battery. The apparatus of the preferred embodiment includes a database to store battery operation information, and a display to graphically illustrate time remaining for operation of the device with the current power supply. The database includes a battery history table 20 and a current battery table 50. FIG. 1 is an illustration of the battery history table 20 that stores historical information pertaining to the power source. The battery history table 20 stores information associated with a specific battery and a specific device the battery is intended to operate. FIG. 2 is an illustration of a current battery table 50 which tracks data associated with operation of the installed battery. Accordingly, data stored in the tables of FIG. 1 and FIG. 2 are used to determine operating time of a device using a specific battery.

The battery history table 20 includes the following fields: Type$_{ID}$ 22, battery type 24, battery brand 26, battery size 28, battery readings 30, Idle$_{BDC}$ 32, Active$_{BDC}$ 34, Off$_{BDC}$ 36, Percent$_{IDLE}$ 38, Percent$_{ACTIVE}$ 40, Percent$_{OFF}$ 42, and Historical$_{BL}$ 44. The type identifier field 22 is an integer assigned to a specific make, model and size of a battery. The battery type field 24 is a data string identifying the chemical composition of the battery. The battery make field 26 is a data string identifying the brand name manufacturer of the battery make and model. The battery size field 28 is a data string defining the size of the battery. The battery readings field 30 is an integer defining the number of batteries the device has used to obtain battery operating measurements.

Each type and make of a battery has a series of battery drainage factors (BDFs) associated therewith. The battery drainage factor is a variable associated with specific type and make of the battery that can be used to dynamically calculate usage time remaining on a battery for a specific device. The Idle$_{BDF}$ field 32 is an integer indicating the battery drainage factor associated with the time period in which the device is in an idle state of operation. The Active$_{BDF}$ field 34 is an integer indicating the battery drainage factor associated with the time period in which the device is in an active state of operation. The Off$_{BDF}$ field 36 is an integer indicating the battery drainage factor associated with the time period in which the device is off. The Percent$_{idle}$ field 38 is a factor in the form of an integer associated with the percent of time the device has historically operated in an idle state. The Percent$_{ACTIVE}$ field 40 is a factor in the form of an integer associated with the percent of time the device has historically operated in an active state. The Percent$_{OFF}$ field 42 is a factor in the form of an integer associated with the percent of time the device has historically remained off. The sum of the Percent$_{IDLE}$ 38, Percent$_{ACTIVE}$ 40, and Percent$_{OFF}$ 42 must equal one hundred. Also the Percent$_{IDLE}$ 38, Percent$_{ACTIVE}$ 40, and Percent$_{OFF}$ 42 values will be the same for all battery types since these values represent the usage pattern of the device and are not battery type dependent. Finally, the Historical$_{BL}$ field 44 is an integer indicating the quantity of time that the battery has had for proper operation of a device. Accordingly, the database stores the historical data fields so that the historical information can be used to accurately predict operating power of a current battery.

In addition to the battery history table 20, a current battery table 50 is provided. The current battery table 50 is used to track usage of the battery that is in operation in the device. This table tracks the time of operation of the battery together with the battery type. The table 50 includes three fields for assigning static data to the operating battery, a Date field 52, which represent the date the current battery in operation was inserted into the device, a Type$_{ID}$ field 56 which is an integer associated with the battery type, and an Insert Time field 54 which represents the time in which the current battery was inserted into the device. The Type$_{ID}$ field 56 is the same as the Type$_{ID}$ field 22 of the battery history table 20. If the battery in operation is selected from a list in the battery history table 20, then the battery type integer will be the same integer as in the Type$_{ID}$ field 22 from the battery history table 20. The battery type information is either manually selected or automatically identified. The remaining fields in the current battery table 50 are used to track time associated with the operating battery. The values in these fields are dynamic as they change with operation of the device and the associated battery. The table includes an Idle$_{TIME}$ field 58 to track the number of seconds the current battery has been in an idle state, an Active$_{TIME}$ field 60 to track the number of seconds the current battery has been operating in an active state, and an Off$_{TIME}$ field 62 to track the number of seconds the current battery has been in the device in which the power has been off. Each of the time tracking fields 56, 58 and 60 measure the time interval in seconds, and the time intervals are all measured from a clock associated with the processor within the device. Accordingly, the current battery table 50 is used to track the different stages of operation of a battery in a particular device based upon a specific battery make and model.

Based upon the current battery table 50 and the battery history table 20, an accurate calculation can be processed to determine the time remaining for operation of the device with the current power source and convey this information to the operator of the device. There are several formulas that are used together to calculate time remaining for operation of the battery power source. The first step is to calculate the used battery life, Used$_{BL}$, of the current battery in operation. The used battery life is calculated as follows:

$$\text{Used}_{BL} = (\text{Idle}_{TIME} \times \text{Idle}_{BDF}) + (\text{Active}_{TIME} \times \text{Active}_{BDF}) + (\text{Off}_{TIME} \times \text{Off}_{BDF}) \quad (1)$$

The factors for Idle$_{BDF}$, Active$_{BDF}$ and Off$_{BDF}$ are each obtained from the integers provided in the battery history table 20. The Idle$_{TIME}$, Active$_{TIME}$ and Off$_{TIME}$ values are each obtained from the entries in the current battery table 50. The battery history table 20 includes a field 44 to store the historical battery life of a specific battery type, brand and size. The remaining life of the battery in operation, Rmaining$_{BL}$, is calculated in seconds as follows:

$$R\text{maining}_{BL} = \text{Historical}_{BL} - \text{Used}_{BL} \quad (2)$$

The Used$_{BL}$ is obtained from Formula 1, and the historical battery life value, Historical$_{BL}$, is obtained from the battery history table 20. Accordingly, the remaining battery life is determined based upon current and past operation of the battery.

The values of battery life remaining on the current battery in operation, as determined in Formula 2, are used in calculating the time remaining for operation of the current battery. This calculation is a sum of the idle time of operation remaining in the current battery, RmIdle$_{TIME}$, the active time of operation remaining in the current battery, RmActive$_{TIME}$, and the off time of operation remaining in the current battery, RmOff$_{TIME}$. The first step in calculating the remaining time for operation of the battery is to determine the remaining idle time of operation, RmIdle$_{TIME}$, which is calculated as follows:

$$RmIdle_{TIME} = \frac{Rmaining_{BL}}{\left[\left(Idle_{BDF} + \left(\frac{Percent_{ACTIVE}}{Percent_{IDLE}} \times Active_{BDF}\right)\right) + \left(\frac{Percent_{OFF}}{Percent_{IDLE}} \times Off_{BDF}\right)\right]} \quad (3)$$

Following the calculation of the remaining idle time, RmIdle$_{TIME}$, from Formula 3, the remaining active time, RmActive$_{TIME}$, of the current battery may be calculated as follows:

$$RmActive_{TIME} = RmIdle_{TIME} \times \left(\frac{Percent_{ACTIVE}}{Percent_{IDLE}}\right) \quad (4)$$

Both the $Percent_{ACTIVE}$ and $Percent_{IDLE}$ are factors that are obtained from the historical database table 20 of FIG. 1. They represent the usage patterns for the device and not the battery. Similar to the calculation of the remaining active time for operation of the current battery, the remaining off time, $RmOff_{TIME}$, for the battery may be ascertained as follows:

$$RmOff_{TIME} = RmIdle_{TIME} \times \left(\frac{Percent_{OFF}}{Percent_{IDLE}}\right) \quad (5)$$

The remaining idle time, remaining active time, and remaining off time are all calculated as a value in seconds. The actual remaining time, $Rm_{TIME}$, for operation of the device for the current battery is calculated as a value in seconds as follows:

$$Rm_{TIME} = RmIdle_{TIME} + RmActive_{TIME} + RmOff_{TIME} \quad (6)$$

Accordingly, the remaining time for operation of a battery operated device is dependent upon usage patterns of the device as well as historical usage of the specific make and model of the battery in use.

In addition to calculating the remaining time for usage of a battery based upon a prior battery of the same make and model, the system also tracks the usage of the current battery while in operation. FIG. 2 is a table with fields for tracking the current battery usage. The date field 52, Insert Date, stores the date the current battery was inserted into the device. This field 52 may be entered by the operator when the battery is inserted into the device. The insert time field 54, $Insert_{TIME}$, is the time on the processor clock when the battery is inserted into the device. The type identifier field 56, $Type_{ID}$, is the identifier for the current battery in the form of an integer. This field 56 is the same identifier as the type identifier field 22 in FIG. 1. The idle time field 58, $Idle_{TIME}$, tracks the time the device has been running in an idle state while utilizing the current battery. The active time field 60, $Active_{TIME}$, tracks the time the device has been running in an active state while utilizing the battery. The off time field 62, $Off_{TIME}$, tracks the time the device has been off or powered down while utilizing the battery. The idle time field 58, the active time field 60 and the off time field 62 are each measured in seconds. Accordingly, the current battery table tracks the usage of the current battery operating in the device.

The battery history table 20 shown in FIG. 1 is based upon the historical usage of batteries for a particular device. At the time a new battery is inserted into the device, the following fields in the battery history table 20 are updated: Batteryreadings 30, $Idle_{BDF}$ 32, $Active_{BDF}$ 34, $Off_{BDF}$ 36, $Percent_{IDLE}$ 38, $Percent_{ACTIVE}$ 40, $Percent_{OFF}$ 42, and $Historical_{BL}$ 44. There are several factors involved in updating these fields in the battery history table 20. The battery drainage factor fields 32, 34 and 36 in the battery history table 20 are factors that include an average calculation between the historical factors and the battery drainage factor of the current battery. The first step in calculating a new battery drainage factor is calculating the potential maximum time for a specific state of operation. The following formulas are used to calculate the maximum time for operation of the device in an idle state of operation, $State_{IDLE}$, an active state of operation, $State_{ACTIVE}$, and an off state of operation, $State_{OFF}$:

$$State_{IDLE} = \frac{Used_{BL}}{Idle_{BDF}} \quad (7)$$

$$State_{ACTIVE} = \frac{Used_{BL}}{Active_{BDF}} \quad (8)$$

$$State_{OFF} = \frac{Used_{BL}}{Off_{BDF}} \quad (9)$$

The used battery life, $Used_{BL}$, value in each of formulas 7, 8 and 9 is different. To determine the used battery life in an idle state of operation, the $Active_{TIME}$ and $Off_{TIME}$ values are set to zero. Similarly, to determine the used battery life in an active state of operation, the $Idle_{TIME}$ and $Off_{TIME}$ values are set to zero, and to determine the used battery life in an off state of operation, the $Active_{TIME}$ and $Idle_{TIME}$ values are set to zero. The following formulas 10, 11, and 12 are then used to calculate the battery drainage factors for the idle, active and off states:

$$CurrentIdle_{BDF} = \frac{Historical_{BL}}{State_{IDLE}} \quad (10)$$

$$CurrentActive_{BDF} = \frac{Historical_{BL}}{State_{ACTIVE}} \quad (11)$$

$$CurrentOff_{BDF} = \frac{Historical_{BL}}{State_{OFF}} \quad (12)$$

The battery drainage factors for the current battery are then averaged with the historical battery drainage factor values to provide new historical battery drainage factors for the battery history table 20 in FIG. 1. The following formulas 13, 14, and 15 are used to average the current battery drainage factors with the historical battery drainage factors:

$$NewIdle_{BDF} = \frac{(Idle_{BDF} \times BatteryReadings) + CurrentIdle_{BDF}}{BatteryReadings + 1} \quad (13)$$

$$NewActive_{BDF} = \frac{(Active_{BDF} \times Batteryreadings) + CurrentActive_{BDF}}{Batteryreadings + 1} \quad (14)$$

$$NewOff_{BDF} = \frac{(Off_{BDF} \times Batteryreadings) + CurrentOff_{BDF}}{Batteryreadings + 1} \quad (15)$$

The battery readings factor, Batteryreadings, in formulas 13, 14 and 15 is obtained from field 30 in the battery history table 20. This value is an integer representative of the number of times the table has been updated. Accordingly, the values for the new battery drainage factors obtained from formulas 13, 14 and 15 replace the old values for the battery drainage factors in table 20 of FIG. 1, and the battery readings factor is incrementally increased by a factor of one to reflect the addition of a new reading as represented by formula 20, below.

Following the process of updating the battery drainage factors in the battery history table 20, the $Percent_{IDLE}$ field 38, $Percent_{ACTIVE}$ field 40 and $Percent_{OFF}$ field 42 in the battery history table 20 may be updated. The following formulas 16, 17, and 18 are used to calculate the new values for these fields:

$$NewPercent_{IDLE} = \frac{\begin{array}{c}(Percent_{IDLE} \times Batteryreadings) + \\ (100 \times Idle_{TIME}) \\ \hline Idle_{TIME} + Active_{TIME} + Off_{TIME}\end{array}}{Batteryreadings + 1} \quad (16)$$

$$NewPercent_{ACTIVE} = \frac{\begin{array}{c}(Percent_{ACTIVE} \times Batteryreadings) + \\ (100 \times Active_{TIME}) \\ \hline Idle_{TIME} + Active_{TIME} + Off_{TIME}\end{array}}{Batteryreadings + 1} \quad (17)$$

$$NewPercent_{OFF} = \frac{\begin{array}{c}(Percent_{OFF} \times Batteryreadings) + \\ (100 \times Off_{TIME}) \\ \hline Idle_{TIME} + Active_{TIME} + Off_{TIME}\end{array}}{Batteryreadings + 1} \quad (18)$$

Accordingly, each of the values obtained from formulas 16, 17 and 18 are entered into the appropriate field of the battery history table 20 and replace the values in the corresponding fields.

In addition to calculating the new historical battery drainage factors and the new percentages of time of operation, a new historical battery life, Historical$_{BL}$ value may be calculated as follows:

$$NewHistorical_{BL} = \frac{(Historical_{BL} \times Batteryreadings) + Used_{BL}}{Batteryreadings + 1} \quad (19)$$

The used battery life value is the used battery life in seconds of the current battery as calculated in Formula 1. The value obtained from equation 19 is then entered into the historical battery life field 44 of the battery history table 20. Finally, as mentioned above, the battery readings field 30 in the battery history table 20 is also updated. The following formula is used to determine the new value for the battery readings field 30:

$$Batteryreadings_{NEW} = Batteryreadings_{OLD} + 1 \quad (20)$$

The value obtained in Formula 20 is an integer, and is placed in the battery readings field 30 to replace the former integer. Accordingly, formulas 7–20 are used to update the variable fields of the battery history table following each stage of usage of a battery in the device (i.e. idle, active, or off).

When the user inserts a new battery into the device, the fields in the current battery table 50 are updated to reflect the presence of a new battery. The date field 52 is updated to the current date. The InsertTime field 54 is updated to the current time to reflect the time the new battery is inserted into the device. The remaining time fields Idle$_{TIME}$ 56, Active$_{Time}$ 58, and Off$_{Time}$ 60 are set to zero. Thereafter, the user may select the battery type, the battery brand and the size of the battery from a menu of batteries on a user interface. Once the battery type, brand and size has been identified, the battery drainage factors associated with the particular battery are automatically selected. This enables the processor to accurately determine the remaining time for operation of the device based upon formulas 1–6. Accordingly, an accurately updated battery history table enables the device to accurately process and calculate the remaining time for operation of the device with a specific battery make and model.

Furthermore, the apparatus and method for calculating time remaining on a particular battery for a specific battery operated device is designed to accommodate switching between the use of the battery and an AC power source or other power source. In the event the operator of the battery operated device switches from use of the battery to an AC power source, the operating system of the device will activate an indicator to stop all internal timers while the AC power source is in use. When the device returns to the prior non-expired battery for it's source of power, the timers will resume operation. Subsequently, the Idle$_{TIME}$, Active$_{TIME}$ and Off$_{TIME}$ fields, 58, 60 and 62, of Table 50 will be updated to reflect the resumption of use of the battery as the power source for the device. Accordingly, the apparatus is design to accommodate an operator switching among different power sources for provision of power to the device.

The apparatus and method are designed to accommodate rechargeable as well as non-rechargeable batteries. If a battery is removed from the device and recharged by an external source, the apparatus will consider the battery to be a new battery when it is inserted into the battery operated device. However, if the battery operated device has the capability of recharging the battery, then the apparatus must accommodate the recharge function. During the recharging of the battery, the device stops the internal timers associated with the Idle$_{TIME}$ field 58 and the Active$_{TIME}$ field 60, and initiates the timer associated with the Off$_{TIME}$ field 62. When the recharging function is complete and battery power is received from the recharged battery, the apparatus subtracts a fraction of the time from the internal time fields in Table 50 in which the device was recharging the battery. The following formula is used to determine the new time values for the time fields 58, 60 and 62 in Table 50:

$$Time_{NEW} = Time_{OLD} - (Fraction \times Time_{RECHARGE}) \quad (21)$$

The Time$_{NEW}$ and Time$_{OLD}$ values in formula 21 is different for each state of operation. For example, to calculate a new Active$_{TIME}$ value, the Time$_{OLD}$ value is taken from field 60 in Table 50. Similarly, to calculate a new Idle$_{TIME}$ value, the Time$_{OLD}$ is taken from field 58 in Table 50, and to calculate a new Off$_{TIME}$ value, the Time$_{OLD}$ is taken from field 62 in Table 50. The fraction is calibrated independently for each device. To calibrate the fraction for the specific device, the device is placed in an active state of operation until the battery(s) is completely drained, CalTime$_{ACTIVE}$. Thereafter, the battery(s) is charged and a clock tracks the time required for recharge of the battery(s), CalTime$_{RECHARGE}$. The fraction adjustment factor is calculated as follows:

$$Fraction = \frac{CalTime_{ACTIVE}}{CalTime_{RECHARGE}} \quad (22)$$

Accordingly, the subtraction of a fraction of the recharge time insures that the time remaining will be more accurately reflected since the longer a battery is recharged the longer the device can operate on the battery.

Advantages Over The Prior Art

The process of calculating the time remaining on a particular battery for operation of a specific device is critical for proper operation of the device. The process for calculating the remaining battery life disclosed herein is based upon factors and formulas specific to a particular battery and specific device. However, the process does not require the use of a battery with a discharge control circuit or a device with a temperature sensor in order to provide an accurate calculation of the time remaining on a battery.

A discharge control circuit is used in some battery or remote power source to estimate the voltage drop of a battery or remote power source based upon the current output of electrical power from the source. However, processes which require a discharge control circuit are reliant on the accuracy of the circuit as well as the increased costs and battery dimensions associated with incorporating a discharge control circuit into the battery. Since the discharge control circuit is incorporated within the battery, the size of the resulting battery and the costs associated with the manufacture of the battery are increased over the cost of a conventional battery which do not utilize a discharge control circuit. Also, the accuracy and reliability of the circuit may become questionable over time. Since, the battery drainage factors are associated with each particular battery type and the percent fields are factors associated with the specific device, no battery control circuit is required. Accordingly, the process for calculating battery time remaining for proper operation may be determined solely on variables and factors associated with a specific device and battery and do not rely upon the presence of a discharge control circuit or the proper operation of that circuit, and do not require a manufacturer to incur the added costs of a "smart" battery which incorporates the circuit into the battery or increase the size of the device to account for the added size of a "smart" battery over the size of a conventional battery with similar performance capabilities.

A temperature sensor is used in some devices to measure the temperature of the device and to use these temperature measurements to predict the operating time remaining of the device with a specific battery. However, processes which require a temperature sensor are reliant on the accuracy of the sensor as well as the increased costs associated with incorporating a temperature sensor into the device. Since, the battery drainage factors are associated with each particular battery type and the percent fields are factors associated with the specific device, no temperature sensor is required. Accordingly, the process for calculating battery time remaining for proper operation may be determined solely on variables and factors associated with a specific battery and the device it is intended to operate and do not rely upon the presence of a temperature sensor or the proper operation of that sensor, and do not require a manufacturer to incur the added costs of incorporating the sensor into the device.

Alternative Embodiments

It will be appreciated that, although specific embodiments of the invention have been described herein for purposes of illustration, various modifications may be made without departing from the spirit and scope of the invention. In particular, the device may include a graphical user interface that enables the operator to enter specific information pertaining to a battery. For example, the interface may provide an option for the operator to select the battery make, model and size from a menu of batteries entered into a database. In addition, the graphical user interface may be used to graphically illustrate to the operator the time remaining for operation of the apparatus with the current power source. The illustration may include indicia in the form of numerical data and/or a graphical illustration. Similarly, the interface may enable an operator to enter a new battery, make and model if the battery placed in the device is not available from the menu. The device may also include an ability to update the historical database with new information available for specific batteries and/or the apparatus the battery is intended to operate. For example, the new information may be placed on a recordable medium, such as an optical disk, or the apparatus may include a communication port to enable an operator to receive updated information by connection to a remote apparatus or a remote network. In addition, battery information may be automatically registered with the device upon installation of a battery. The device may obtain the battery information from the battery or markings associated therewith. Accordingly, the scope of protection of this invention is limited only by the following claims and their equivalents.

What is claimed is:

1. A method for calculating capacitance remaining in a battery powered apparatus comprising the steps of:

dynamically tracking usage of a power source; and calculating time remaining for usage of said power source operating a device based upon a battery drainage factor and a historical battery life value of said power source for said apparatus, wherein said battery drainage factor is a variable specific to a power source type and said apparatus.

2. The method of claim 1, further comprising graphically displaying remaining power usage time.

3. The method of claim 1, wherein the step of dynamically tracking usage of said power source includes tracking current and past usage patterns.

4. The method of claim 1, further comprising the step of identifying a battery make and model.

5. The method of claim 4, wherein the step of identifying said battery make and model includes entering said battery make and model into an interface.

6. The method of claim 1, wherein the battery drainage factor is selected from a group consisting of: an idle battery drainage factor, an active battery drainage factor, and an off battery drainage factor.

7. The method of claim 1, further comprising the step of storing a prior battery's battery drainage factor in a historical table prior to installation of a subsequent battery into said battery powered device.

8. The method of claim 7, further comprising the step of averaging said prior battery's battery drainage factor with a historical battery drainage factor for producing a new historical battery drainage factor.

9. The method of claim 1, wherein said historical battery life value includes data selected from the group consisting of: percent of time said apparatus has been in an active state, percent of time said apparatus has been in an off state, and percent of time said apparatus has been in an idle state.

10. An apparatus adapted to receive a power source, comprising:

a database of battery performance data; and an algorithm adapted to determine usage time remaining in said power source based upon a battery drainage factor identified from battery type data in said database and historical usage of the power source for a specific device, wherein said battery drainage factor is a variable specific to said device and said battery type.

11. The apparatus of claim 10, wherein said database of battery performance data is selected from a group consisting of: a database of past battery performance data, and a database of current battery performance data.

12. The apparatus of claim 11, wherein said database of past battery performance data includes data selected from a group consisting of: battery type, battery size, battery make, battery drainage factors, device usage patterns, and combinations.

13. The apparatus of claim 11, wherein said database of current battery performance data includes data selected from a group consisting of: time battery was inserted into said apparatus, time battery has been idle, time battery has been active, and time battery has been off, and combinations thereof.

14. The apparatus of claim 10, further comprising an interface integral to said apparatus to enable an operator to interact with said database.

15. The apparatus of claim 10, further comprising a display to convey usage time remaining.

* * * * *